US008247766B2

United States Patent
Deconihout et al.

(10) Patent No.: US 8,247,766 B2
(45) Date of Patent: Aug. 21, 2012

(54) DEVICE FOR GENERATING WIDE SPECTRAL BAND LASER PULSES, PARTICULARLY FOR A TOMOGRAPHIC ATOM PROBE

(75) Inventors: Bernard Deconihout, Rouen (FR); François Vurpillot, Rouen (FR); Angela Vella, Rouen (FR)

(73) Assignees: Cameca (FR); Centre National de la Recherche Scientifique (CNRS) (FR)

( * ) Notice: Subject to any disclaimer, the term of this patent is extended or adjusted under 35 U.S.C. 154(b) by 0 days.

(21) Appl. No.: 12/997,458

(22) PCT Filed: Jun. 9, 2009

(86) PCT No.: PCT/EP2009/057079
§ 371 (c)(1),
(2), (4) Date: May 20, 2011

(87) PCT Pub. No.: WO2010/000574
PCT Pub. Date: Jan. 7, 2010

(65) Prior Publication Data
US 2011/0210245 A1    Sep. 1, 2011

(30) Foreign Application Priority Data
Jun. 10, 2008    (FR) ..................... 08 03218

(51) Int. Cl.
*H01J 49/00*    (2006.01)
(52) U.S. Cl. ......... 250/306; 250/307; 250/288; 250/309

(58) Field of Classification Search .......... 250/306–307, 250/309, 288, 282, 492.1
See application file for complete search history.

(56) References Cited

U.S. PATENT DOCUMENTS

| | | | |
|---|---|---|---|
| 2007/0181826 A1* | 8/2007 | Bunton et al. | ............. 250/491.1 |
| 2007/0205358 A1* | 9/2007 | Bunton et al. | ................ 250/282 |
| 2010/0067555 A1* | 3/2010 | Austin et al. | .................... 372/25 |
| 2010/0116985 A1* | 5/2010 | Bunton et al. | ................ 250/307 |
| 2010/0294928 A1* | 11/2010 | Bunton et al. | ................ 250/307 |

FOREIGN PATENT DOCUMENTS
WO    2008/003138 A1    1/2008

OTHER PUBLICATIONS

B. Gault, et al., "Ultrafast Laser Assisted Field Evaporation and Atom Probe Tomography Applications", Journal of Physics Conference Series, 2007, pp. 132-135, vol. 59, XP002565971.

(Continued)

*Primary Examiner* — David A Vanore
*Assistant Examiner* — Wyatt Stoffa
(74) *Attorney, Agent, or Firm* — Baker & Hostetler, LLP

(57) ABSTRACT

A wide spectral band laser pulse generating device capable of covering a spectrum formed of given wavelengths is provided, including: a monochromatic laser light source whose intensity is adjustable; non-linear optical means, a photonic crystal or a microstructured optical fiber for example, for carrying out spectral widening of the wave emitted by the light source; the light source and the non-linear optical means are configured and arranged so as to create a white supercontinuum whose continuous spectrum contains the wavelengths considered. The invention relates to the general field of the analysis of the composition of material specimens, and in particular to laser tomographic atom probes.

7 Claims, 1 Drawing Sheet

OTHER PUBLICATIONS

Hyungsik Lim, et al., "Ultrahigh-Resolution Optical Coherence Tomography with a Fiber Laser Source at 1 mum", Optics Letters, May 15, 2005, pp. 1171-1173, vol. 30, No. 10, XP002565972.

R.R. Alfano, "The Ultimate White Light", Scientific American, Inc., Dec. 1, 2006, pp. 86-93, vol. 295, No. 6, XP002511467.

R.R Alfano, "The Supercontinuum Gains Momentum", Laser Focus World, May 1, 2005, vol. 41, No. 5, www.laserfocusworld.com/articles/print.html?id=232485&bPool=LFW.pennnet.com%2farticle_tool_bar, XP002511468.

J. Solis, et al., "Evidence of a Nonthermal Mechanism for Ejection of Ions and Neutrals During Exclmer Laser Ablation of Ge", Journal of Applied Physics, Sep. 15, 1993, pp. 4271-4273, vol. 74, No. 6, XP002511469.

A Vella, et al., "Evidence of Field Evaporation Assisted by Nonlinear Optical Rectification Induced by Ultrafast Laser", Physical Review B (Condensed Matter and Materials Physics), Apr. 15, 2006, pp. 165416-1-165416-7, vol. 73, No. 16, The American Physical Society, XP002511470.

Thomas F. Kelly, et al., "Atom Probe Tomography Defines Mainstream Microscopy at the Atomic Scale", Microscopy Today, Jul. 1, 2006, pp. 34-40, XP002511471.

* cited by examiner

DEVICE FOR GENERATING WIDE SPECTRAL BAND LASER PULSES, PARTICULARLY FOR A TOMOGRAPHIC ATOM PROBE

CROSS-REFERENCE TO RELATED APPLICATIONS

This application is a National Stage of International patent application PCT/EP2009/057079, filed on Jun. 9, 2009, which claims priority to foreign French patent application No. FR 0803218, filed on Jun. 10, 2008, the disclosures of which are incorporated by reference in their entirety.

FIELD OF THE INVENTION

The present invention relates to the general field of the analysis of the composition of material specimens. It relates more particularly to analysis devices operating by evaporation of a material specimen by means of a laser, in particular tomographic atom probes.

BACKGROUND

It is known that in a device of the laser-assisted tomographic atom probe type, a DC voltage is applied to the material specimen to be analyzed. This specimen takes the form of a machined tip, brought to a given electrical potential, the end of which is illuminated by focussed laser pulses, the energy supplied by the pulses causing the evaporation of the atoms constituting the material. According to a known principle, field evaporation is thus brought about by the electric field generated by the interaction of the laser pulse with the tip. In practice, the intensity of the laser pulse must be determined so as to provide for as brief a time as possible, the energy just necessary to evaporate an atomic layer fraction atom by atom.

It is known that too great an energy and/or too long a pulse duration have the known consequences on the one hand of altering the mass spectrum obtained due to altering the resolution (presence of spectral trails) and on the other hand, notably in the case where the intensity of the pulse is too great, to lead to the destruction of the specimen by both thermal and electrostatic effect.

Accordingly the person skilled in the art who implements a laser atom probe is faced with the tricky problem consisting in determining a minimum intensity level of the pulses which is both sufficient to guarantee evaporation of the elements constituting the material of the tip (and therefore the analysis of the material) and insufficient to give rise to an unacceptable degradation of the mass spectrum and to give rise to destruction of the specimen.

However, this optimal value of intensity is difficult to determine. Indeed, it is known that this optimal value is dependent on several parameters. It depends at one and the same time on the wavelength of the pulses emitted, the composition of the material analyzed and the exact geometry of the specimen tip (radius of curvature, cone angle, dimensions and regularity of shape).

Now, the exact composition of the analyzed material is on principle not known exactly, otherwise the analysis of the mass spectrum would not be necessary. Likewise, neither is the exact geometry of the material specimen rigorously controlled. Furthermore, the geometry of the specimen varies in the course of the analysis on account of the loss of material caused by evaporation.

Consequently, in the current state of the art, the obtaining of laser pulses having the optimal intensity requires empirical adjustment and the person skilled in the art is generally compelled, having regard to the laser source employed, to undertake the adjustment of the intensity of the laser pulses by trial and error. Furthermore, to perform the analysis of various specimens of materials, he is generally compelled to carry out a specific adjustment for each specimen analyzed, even in the case where the specimens analyzed are made from one and the same material. Moreover, because the geometry of the specimen varies in the course of the analysis, the person skilled in the art is generally also compelled to modify the intensity adjustment during analysis so as to preserve the quality of the mass spectra.

Hence, for the person skilled in the art, to carry out repetitive analyses making it possible for example to check that a method for making a composite material does indeed provide a material of constant composition, turns out to be a difficult and irksome operation which sometimes leads to the destruction of certain specimens and which gives rise to their replacement.

SUMMARY OF THE INVENTION

An aim of the invention is to propose a solution making it possible to solve the problems mentioned above, stated otherwise to propose a solution for producing, within the framework of a laser atom probe, light pulses whose intensity is sufficient to ensure the evaporation, atomic layer after atomic layer, of the elements constituting the specimen, although insufficient to lead to the destruction of the specimen undergoing analysis or to lead to the obtaining of a mass spectrum of unacceptable resolution.

For this purpose, the subject of the invention is a wide spectral band laser pulse generating device for carrying out the emission of light pulses whose spectrum consists of particular wavelengths, which laser pulse generator comprises:
- a monochromatic laser light source whose intensity is adjustable;
- non-linear optical means for carrying out spectral widening of the wave emitted by the light source;
- the light source and the non-linear optical means being configured and arranged so as to create a white supercontinuum whose continuous spectrum contains the particular wavelengths.

According to one embodiment of the invention, the non-linear optical means consist of a photonic crystal element.

According to one variant embodiment of the invention, the photonic crystal element is composed of silicon oxide.

According to another variant embodiment of the invention, the photonic crystal element is composed of aluminum oxide.

According to another embodiment of the invention, the non-linear optical means consist of a microstructured optical fiber.

The subject of the invention is also a tomographic atom probe for analyzing a material specimen placed in an analysis chamber and comprising means for generating light pulses intended to produce the evaporation of the material specimen to be analyzed and means for guiding these pulses onto the specimen, the means for generating the light pulses consisting of the wide band laser pulse generating device according to the invention.

According to the invention, the evaporation of the specimen occurring by non-linear optical field effect for a resonance wavelength which varies during analysis, the wide band laser pulse generating device of the tomographic atom probe is configured to produce a white supercontinuum able to cover the set of values taken by the resonance wavelength in the course of the analysis.

According to the invention furthermore, the light source of the wide band laser pulse generating device is configured so that the intensity of the light pulses generated is such that the evaporation of the specimen is caused only by non-linear optical field effect at the resonance wavelength.

The light pulse generator according to the invention advantageously makes it possible to carry out for each laser pulse a point-wise evaporation of the material specimen analyzed, thereby making it possible to obtain a mass spectrum of good resolution. It also makes it possible to avoid the destruction of a material specimen undergoing analysis. It also makes it possible, on the basis of one and the same adjustment of the intensity of the light source, to carry out the analysis of several specimens of one and the same material which are identical to within manufacturing tolerances. It furthermore makes it possible to deliver the wavelength best suited to a specimen, whatever its shape or its nature. Finally, in the case of a phase change during analysis, it makes it possible to avoid having to change the color of the laser to ensure evaporation and limit the effects of degradation of the mass spectrum.

BRIEF DESCRIPTION OF THE DRAWINGS

The characteristics and advantages of the invention will be better appreciated by virtue of the description which follows, which description is supported by the appended FIGS. 1 and 2 which present.

DETAILED DESCRIPTION

Figure 1:
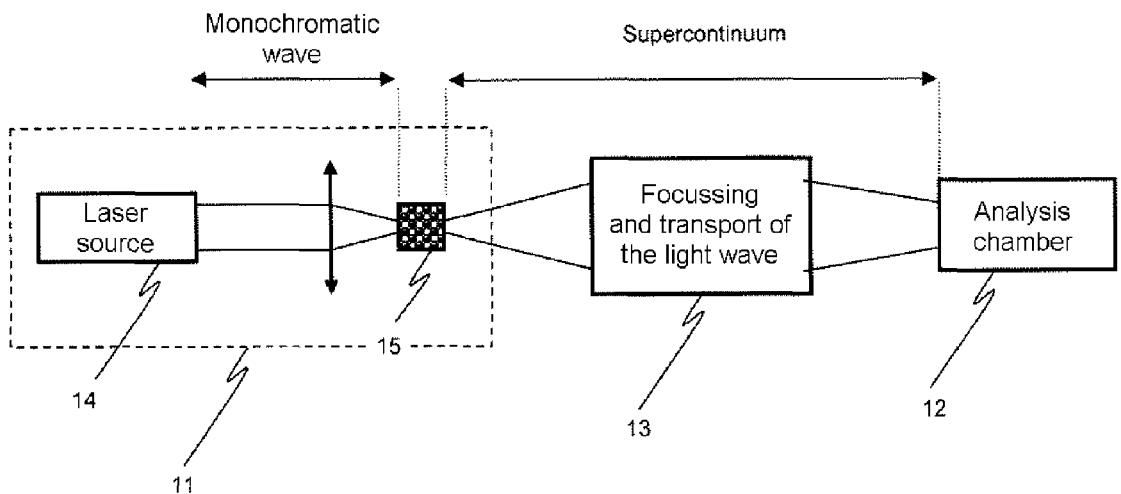
FIG. 1, the schematic overview of a first exemplary implementation of the device according to the invention in a laser atom probe.

To comprehend the advantages afforded by the device according to the invention, it is necessary to consider the operating principle of a tomographic atom probe. It is recalled for this purpose that the tomographic atom probe is a time of flight mass spectrometer, well known to the person skilled in the art, making it possible to analyze a specimen atom by atom. The data gathered make it possible to represent the volume of the specimen destroyed on the scale of the atomic lattice, as well as the chemical nature of each atom. This specimen is generally a sharp tip of a material which may be conducting, insulating or semi-conducting. It is also recalled that the mass resolution of a femtosecond (fs) laser pulse-assisted atom probe, that is to say a probe in which the elements constituting the specimen are evaporated by means of light pulses whose duration is of the order of a few femtoseconds, depends on the duration for which ions are emitted following the emission of a pulse.

The experiments conducted by the applicant show that this duration itself depends on the physical mechanism actually involved in the evaporation. It is thus possible to distinguish a slow evaporation mechanism (that is to say greater than a few nanoseconds) by thermal effect and an ultrafast evaporation mechanism by non-linear optical field effect (of the order of a picosecond), the latter mechanism advantageously producing a quasi-instantaneous, athermal effect of stripping away the elements of the specimen. The slow thermal evaporation mechanism is for its part mainly responsible for the limitation of the mass resolution of an atom probe.

These experiments show moreover that, for a given material specimen, the fast evaporation effect preferably occurs for a specific wavelength which depends on the material analyzed. They also show that for this particular wavelength, here called the tuning wavelength, the intensity of the optical pulse necessary to cause fast evaporation is substantially weaker than for the other wavelengths so that the slow thermal effect previously mentioned is substantially attenuated. They show, furthermore, that for one and the same analyzed material, this wavelength depends substantially on the shape and exact dimensions of this specimen.

It is thus noted that for two specimens of one and the same material, which are identical to within production uncertainties, this wavelength may be substantially different, so that from one specimen to another the influence of the evaporation by slow thermal effect may vary significantly.

It is furthermore noted that for one and the same analyzed specimen, a specimen in the form of a tip or tapered cone for example, this wavelength can vary substantially in the course of the analysis of the specimen, through the very fact that the radius of curvature (or the cone angle) of the analyzed specimen varies noticeably as the evaporation of the elements occurs. A significant variation of the influence of the evaporation by slow thermal effect is then evident in the course of the analysis.

It is furthermore noted that, for a composite material specimen formed of various elements, an alloy for example, this wavelength can vary according to the atomic layer evaporated. Here again, a significant variation of the influence of the evaporation by slow thermal effect is then evident in the course of the analysis.

The experiments conducted by the applicant therefore show, in summary, that the use of laser pulses of fixed wavelength, even if the duration of the pulses is of the order of a few hundred femtoseconds, and even if the wavelength is not chosen at random, may nevertheless lead to the appearance of a sizable thermal effect.

If the above findings are considered, it is noted that the solution of the general problem encountered by the person skilled in the art who wishes to carry out analyses of material specimens by means of a tomographic probe with a satisfactory mass resolution, no longer consists in finding a means of dynamic adjustment of the intensity of the pulses emitted by the light source, but consists rather, according to the invention, in proposing a means for illuminating the specimen with pulses whose wavelength corresponds at each instant of illumination to the previously defined tuning wavelength.

Accordingly, the proposed solution consists in replacing the fixed-wavelength light source used to generate the light pulses intended to illuminate the specimen in equipment of tomographic atom probe type with a wide band light pulse generating device according to the invention comprising the following elements:

a monochromatic light source of variable intensity;
non-linear optical means for carrying out spectral widening of the wave emitted by the light source.

Figure 2:
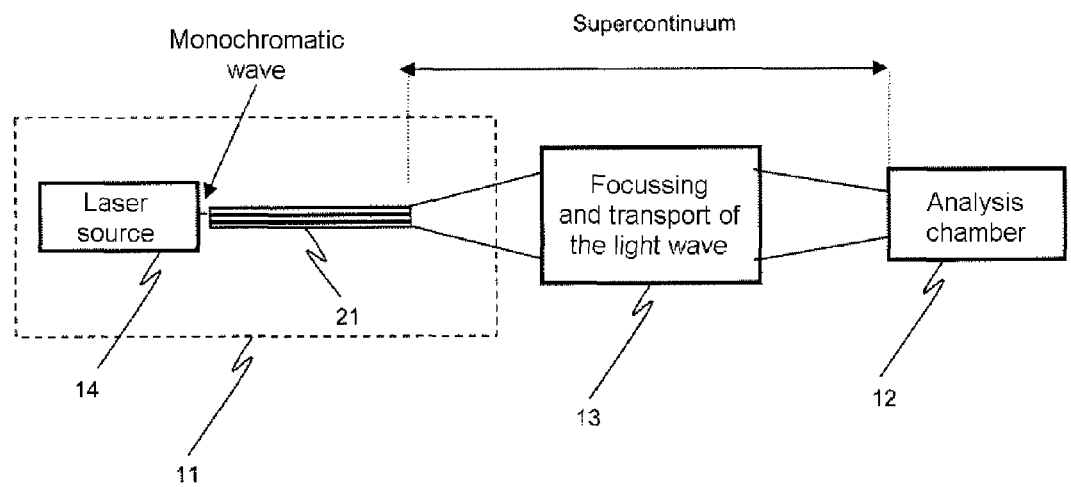
FIG. 2, the schematic overview of a second exemplary implementation of the device according to the invention in a laser atom probe.

FIGS. 1 and 2 illustrate two possible embodiments of the device according to the invention through the schematic functional representation of a tomographic atom probe which figures on the one hand the means 11 according to the invention, making it possible to produce the wide band light pulses intended to cause the vaporization of the specimen, on the other hand guidance and focussing means 13 and on the other hand furthermore the functional part of the probe, the analysis chamber 12, in which the specimen is positioned.

According to the invention, the light source 14 and the non-linear optical means 15 or 21 are arranged so as to produce a supercontinuum.

It is recalled here that the formation of a supercontinuum is a non-linear optics phenomenon which corresponds to a very pronounced spectral widening caused by an electromagnetic wave. Here the supercontinuum follows the passage of the monochromatic light wave produced by the light source through the non-linear optical means. The non-linear effects widen the spectrum of the starting beam as it crosses the material.

According to the invention, the non-linear optical means 15 or 21 used are chosen and configured in such a way that the spectral widening is sufficient to cover the set of useful resonance wavelengths and that the spectrum obtained is an advantageously continuous spectrum. What is commonly called a white supercontinuum is thus produced.

The wide band light pulses thus produced are transported in the vicinity of the specimen, in a conventional manner, by guidance and focussing means 13. However, the passband of the means used is here suited to the spectral crowding of the wide band light pulse thus produced.

The non-linear optical means 15 or 21 intended to widen the spectrum of the wave emitted by the source 14 can consist of various known means. It is, for example, possible to use a highly non-linear microstructured optical fiber 21 as illustrated by FIG. 2, or still more simply a photonic crystal element, silicon dioxide ($SiO_2$) or aluminum oxide ($Al_2O_3$) for example, inside which the light wave produced by the source 14 is focussed, as illustrated by FIG. 1. In both these cases, these known means are here dimensioned so as to admit the power emitted by the light source 14.

The device according to the invention advantageously makes it possible to produce in a simple manner light pulses whose spectrum covers the entirety of the resonance wavelengths allowing an evaporation of the atoms constituting the specimen, the evaporation by field effect of the atoms of a specimen, and thus to limit the evaporation by thermal effect.

On account of this wide spectral coverage, it furthermore advantageously makes it possible, simply by limiting the power of the light source, to produce pulses whose intensity is just sufficient so that only the spectral component whose wavelength corresponds to the resonance wavelength of the material at the instant considered acts on the specimen and produces its evaporation. Thus, whatever its exact geometry at the instant of emission of a light pulse, the specimen is naturally exposed to the corresponding resonance wavelength, which favors the appearance of the ultrafast (and athermal) effect of evaporation by non-linear optical field effect. Furthermore, the risks of specimen destruction are thereby limited.

The invention claimed is:

1. A tomographic atom probe for analyzing a material specimen placed in an analysis chamber comprising means for generating light pulses suitable for producing a controlled evaporation, atomic layer by atomic layer, of a material specimen to be analyzed and means for guiding these pulses onto the specimen, wherein said means for generating said light pulses includes a wide spectral band laser pulse generating device comprising: a monochromatic laser light source whose intensity is adjustable; non-linear optical means for carrying out spectral widening of the wave emitted by the light source; the light source and the non-linear optical means being configured and arranged, as a function of the nature and of the shape of the analyzed specimen, so as to create a white supercontinuum whose continuous spectrum covers the set of wavelengths liable to cause for each wide band pulse a fast evaporation, by non-linear optical field effect, of the specimen throughout the analysis; the intensity of the light source being adjusted in such a way that the evaporation of the specimen by thermal effect in the course of the analysis is minimal.

2. The tomographic atom probe as claimed in claim 1, wherein, the evaporation of the specimen occurring by non-linear optical field effect for a resonance wavelength which varies during analysis, the wide band laser pulse generating device is configured to produce a white supercontinuum able to cover the set of values taken by the resonance wavelength in the course of the analysis.

3. The tomographic atom probe as claimed in claim 2, wherein the light source of the wide band laser pulse generating device is configured so that the intensity of the light pulses generated is such that the evaporation of the specimen is caused only by non-linear optical field effect at the resonance wavelength.

4. The device as claimed in claim 1 wherein the non-linear optical means comprises a photonic crystal element.

5. The device as claimed in claim 4, wherein the photonic crystal element comprises silicon oxide.

6. The device as claimed in claim 4, wherein the photonic crystal element comprises aluminum oxide.

7. The device as claimed in claim 1 wherein the non-linear optical means comprises a microstructured optical fiber.

* * * * *